United States Patent
Yang et al.

(10) Patent No.: US 10,515,707 B2
(45) Date of Patent: Dec. 24, 2019

(54) TEMPERATURE COMPENSATION FOR UNSELECTED MEMORY CELLS AND STRING SELECT SWITCHES IN NAND FLASH MEMORY

(71) Applicant: MACRONIX INTERNATIONAL CO., LTD., Hsinchu (TW)

(72) Inventors: Yih-Shan Yang, Hsinchu (TW); Shin-Jang Shen, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 94 days.

(21) Appl. No.: 15/935,516

(22) Filed: Mar. 26, 2018

(65) Prior Publication Data
US 2019/0295667 A1 Sep. 26, 2019

(51) Int. Cl.
| | | |
|---|---|---|
| G11C 11/00 | (2006.01) |
| G11C 16/34 | (2006.01) |
| G11C 16/04 | (2006.01) |
| G11C 16/08 | (2006.01) |
| G11C 16/10 | (2006.01) |
| G11C 16/24 | (2006.01) |
| G11C 16/26 | (2006.01) |

(52) U.S. Cl.
CPC ...... G11C 16/3427 (2013.01); G11C 16/0483 (2013.01); G11C 16/08 (2013.01); G11C 16/10 (2013.01); G11C 16/24 (2013.01); G11C 16/26 (2013.01); *G11C 16/3436* (2013.01)

(58) Field of Classification Search
CPC ..... G11C 16/0483; G11C 16/26; G11C 16/10; G11C 11/5642; G11C 16/08; G11C 16/3459; G11C 11/5628; G11C 16/16; G11C 16/24; G11C 16/3427; G11C 16/32; G11C 16/30; G11C 2213/71; G11C 16/349; G11C 2029/0411

See application file for complete search history.

(56) References Cited

U.S. PATENT DOCUMENTS

| | | | |
|---|---|---|---|
| 7,342,831 B2 | 3/2008 | Mokhlesi et al. | |
| 7,391,650 B2 | 6/2008 | Mokhlesi et al. | |
| 7,460,407 B2 | 12/2008 | Mokhlesi et al. | |
| 7,463,528 B2 | 12/2008 | Mokhlesi et al. | |
| 7,583,539 B2 * | 9/2009 | Sekar | G11C 7/04 365/185.18 |

(Continued)

*Primary Examiner* — Hien N Nguyen
(74) *Attorney, Agent, or Firm* — Haynes Beffel & Wolfeld LLP

(57) ABSTRACT

A memory device comprises a first NAND string that includes a first plurality of memory cells and a first string select switch arranged in series, the first string select switch disposed between a first bit line and a first end of the first plurality, a second NAND string that includes a second plurality of memory cells and a second string select switch arranged in series, the second string select switch disposed between a second bit line and a first end of the second plurality, word lines coupled to memory cells in the first plurality and memory cells in the second plurality, and a string select line coupled to the first and second string select switches. A method of operating such a memory device comprises applying a voltage varying in a manner complementary to absolute temperature to at least one of the word lines and the string select line.

14 Claims, 10 Drawing Sheets

(56) References Cited

U.S. PATENT DOCUMENTS

| | | | |
|---|---|---|---|
| 8,582,381 B2 * | 11/2013 | Oowada | G11C 11/5642 365/185.03 |
| 9,202,579 B2 | 12/2015 | Hsiung et al. | |
| 9,922,714 B1 * | 3/2018 | Yu | G11C 16/14 |

* cited by examiner

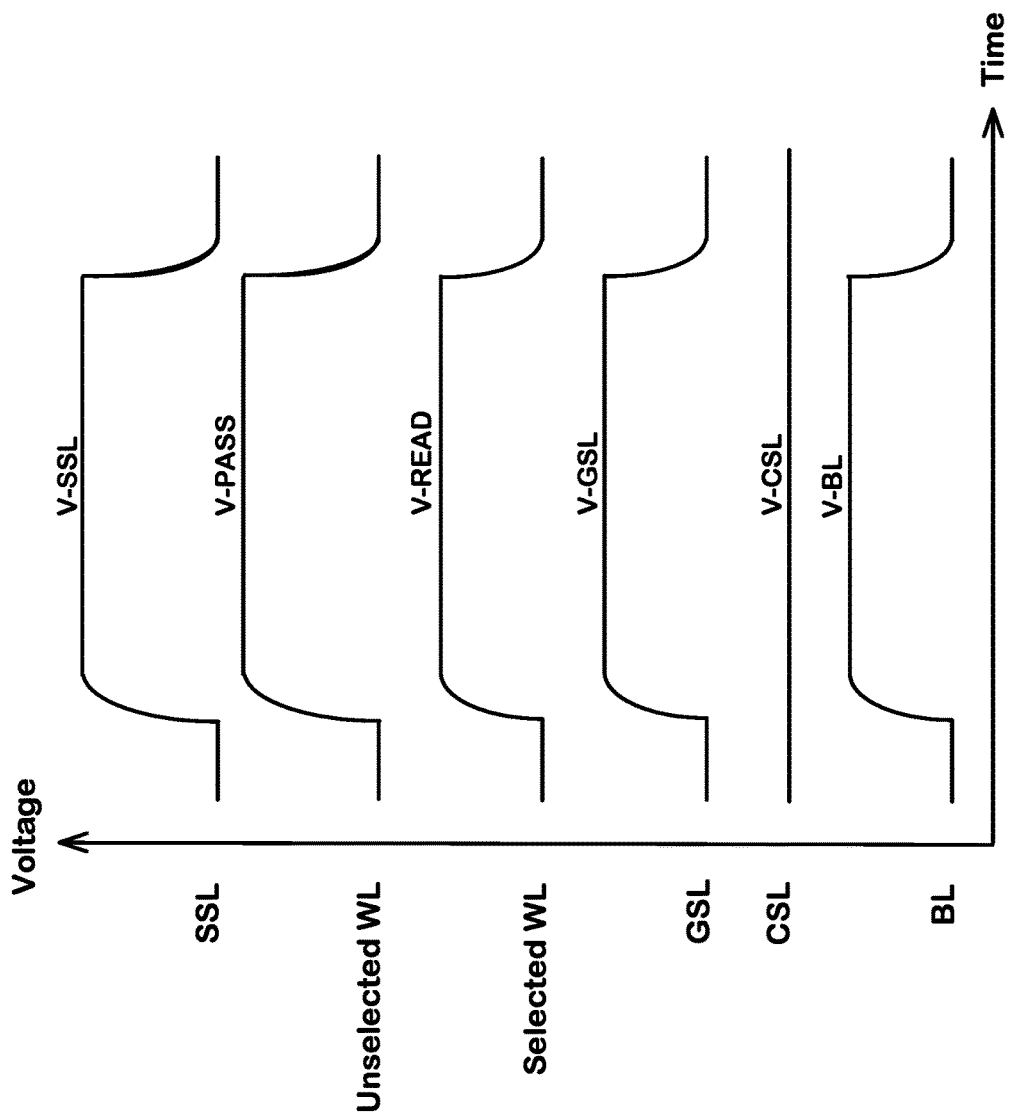
FIG. 2: Conventional read operation

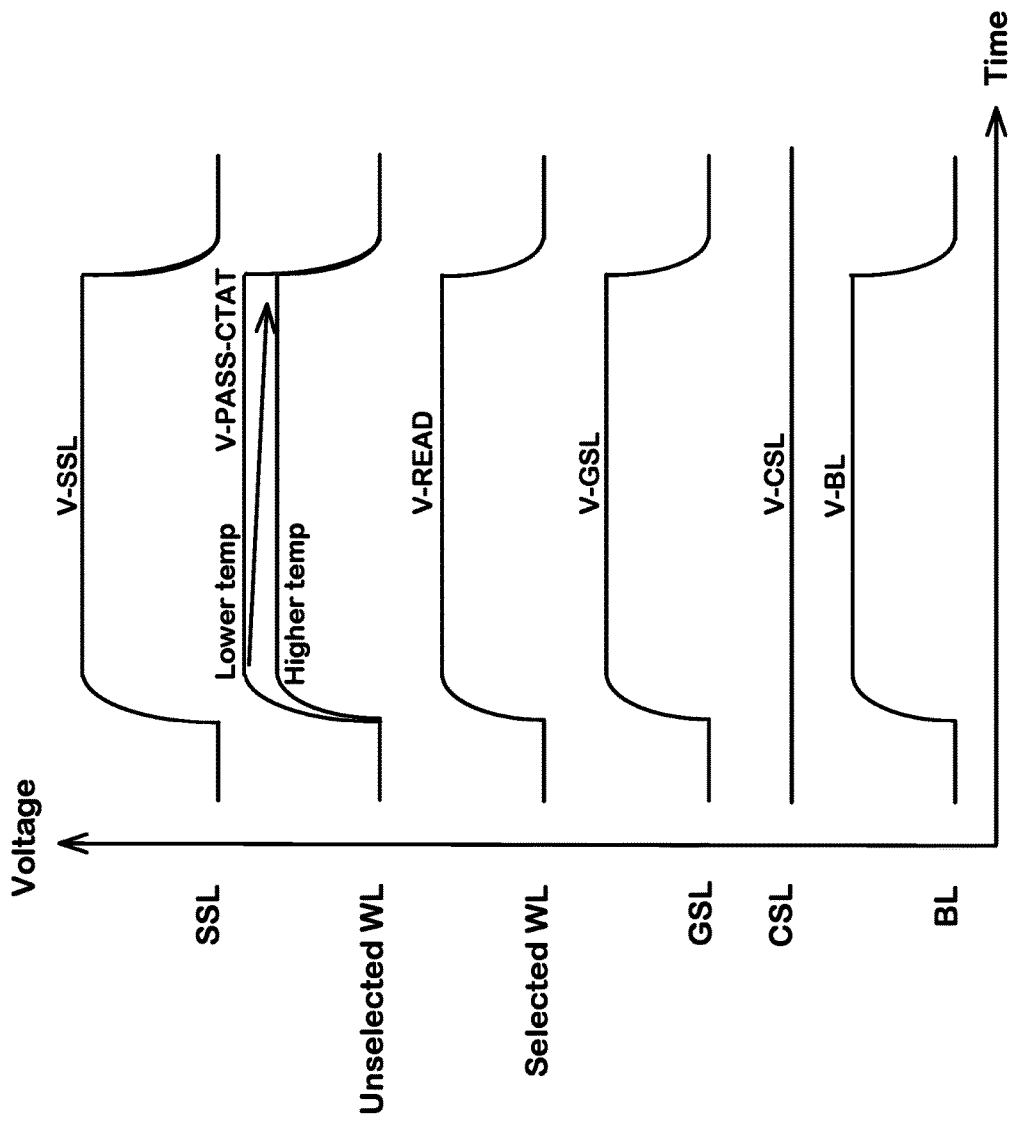
FIG. 3: Apply CTAT to unselected WLs

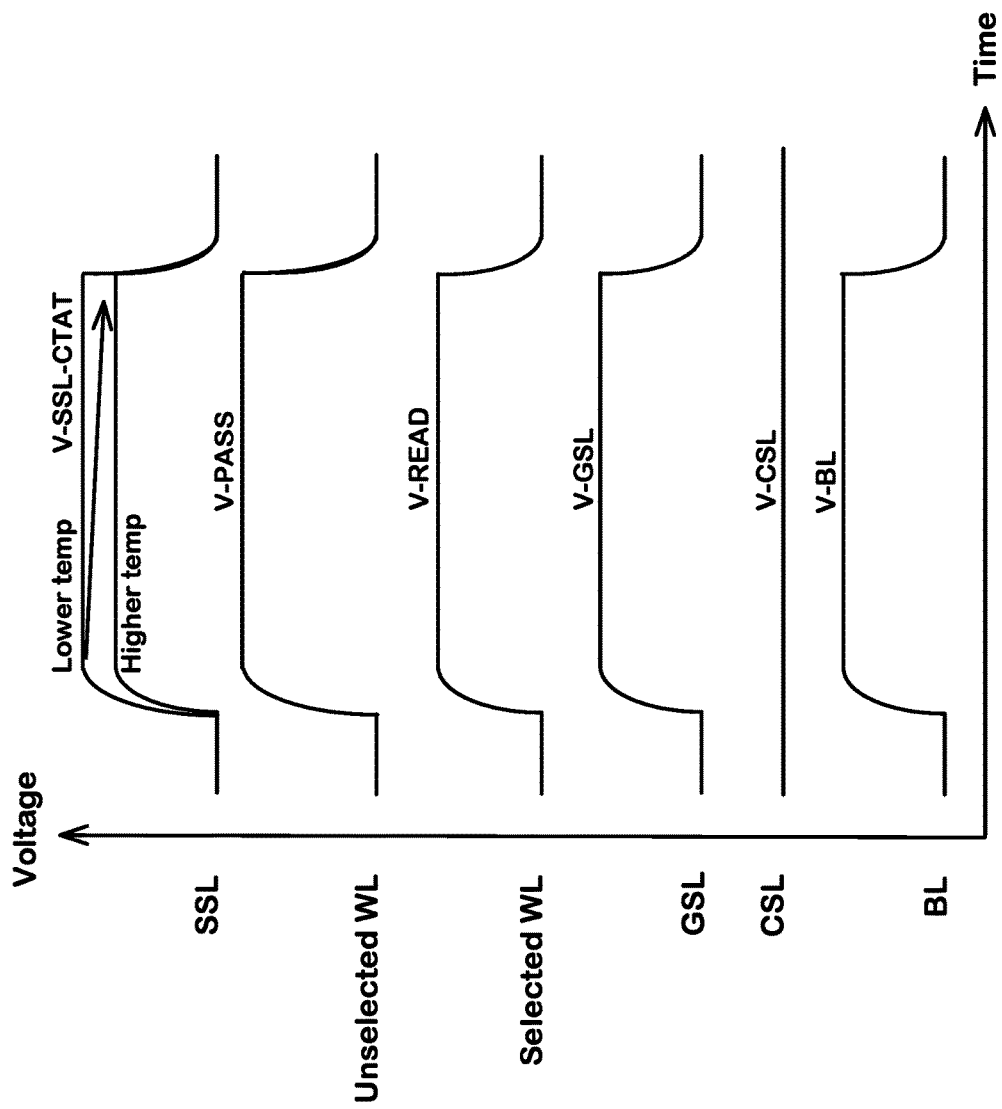
FIG. 4: Apply CTAT to SSL

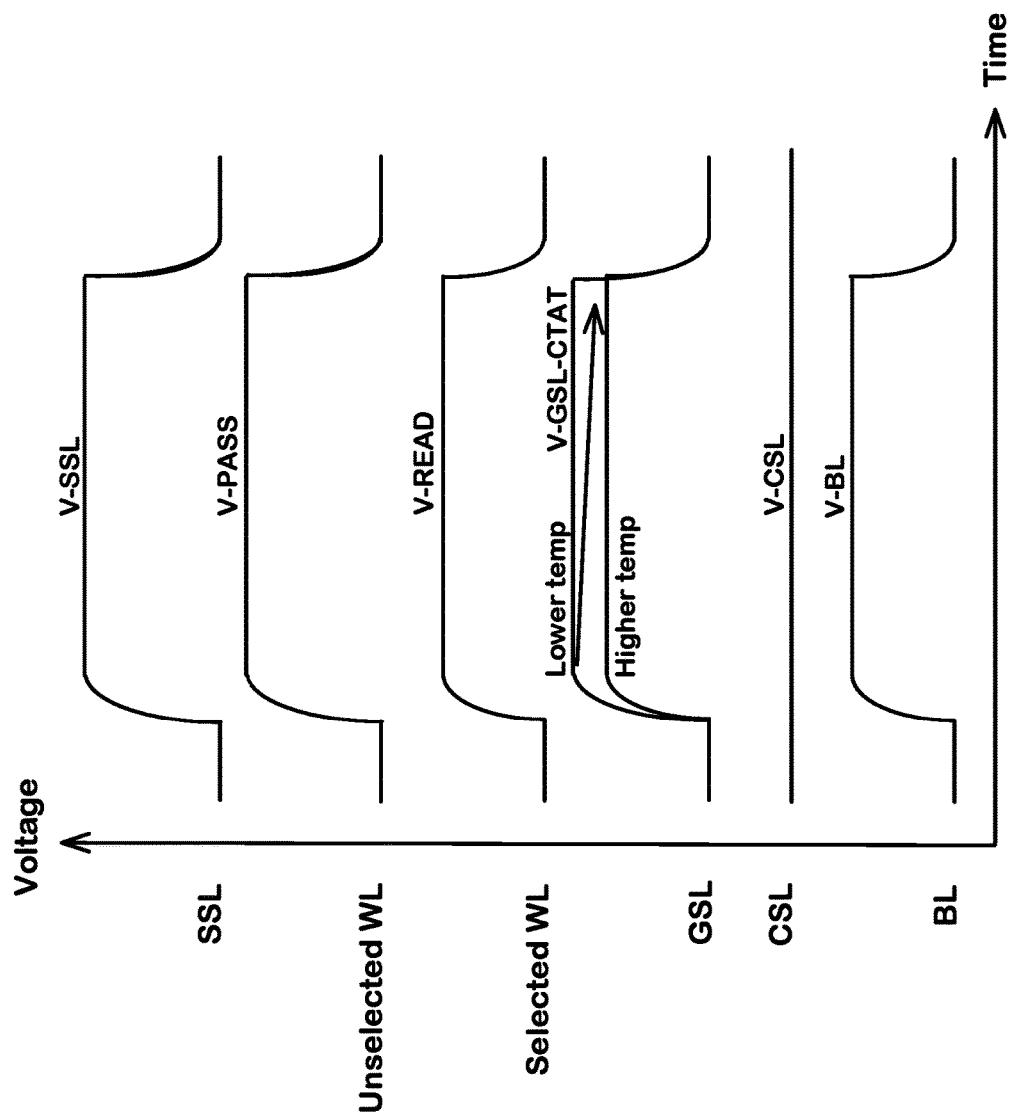
FIG. 5: Apply CTAT to GSL

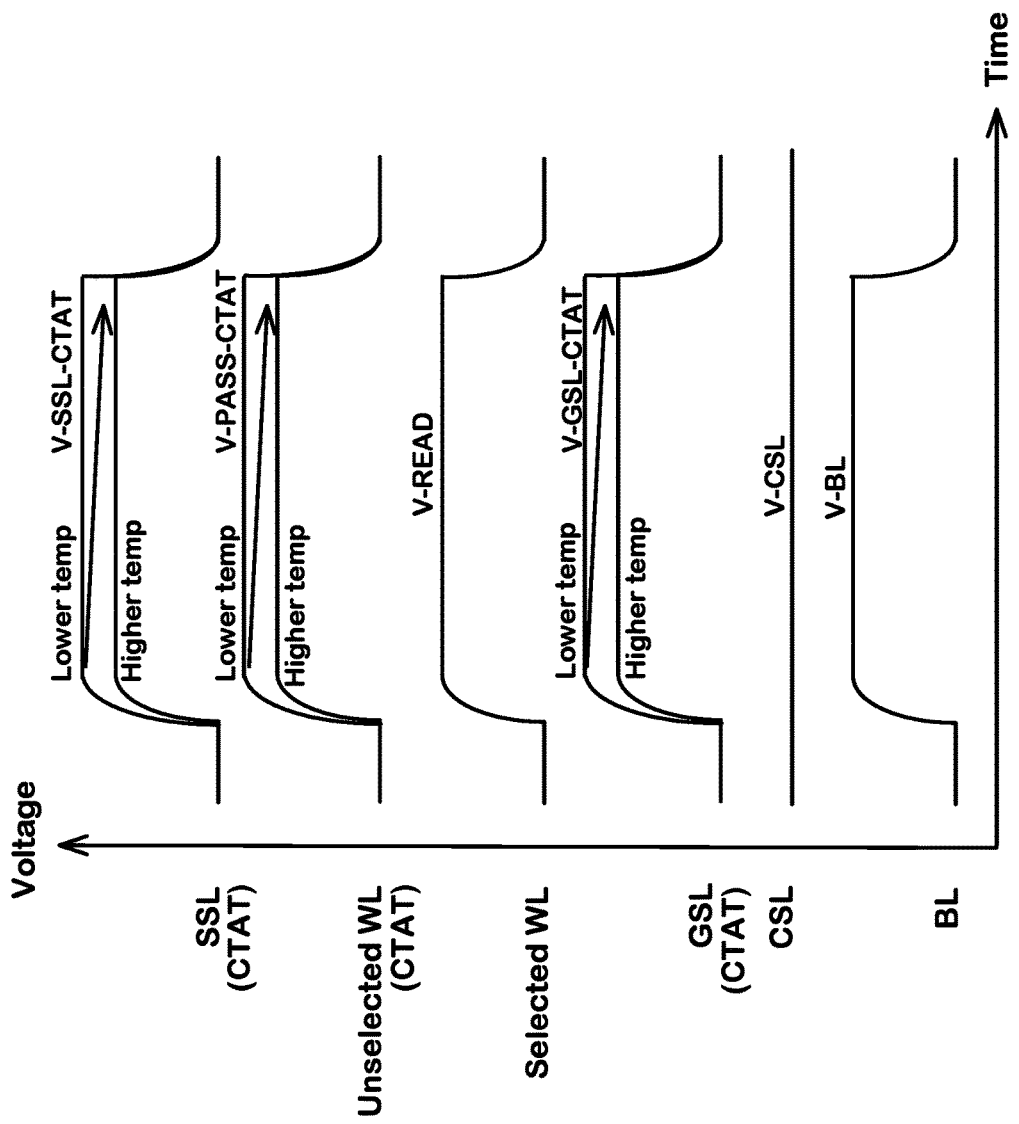
FIG. 6: Apply CTAT to unselected WLs, SSL and GSL

TEMPERATURE COMPENSATION FOR UNSELECTED MEMORY CELLS AND STRING SELECT SWITCHES IN NAND FLASH MEMORY

BACKGROUND

Field

The present invention relates to flash memory, and more particularly to operating flash memory in a NAND configuration.

Description of Related Art

In a NAND flash structure, a NAND string typically includes a string select transistor with its drain terminal connected to a bit line and its gate terminal connected to a string select line (SSL), and a ground select transistor with its source terminal connected to a common source line (CSL) and its gate terminal connected to a ground select line (GSL). Memory cells on the NAND string are between the string select transistor and the ground select transistor. Word lines are coupled to the gate terminals of the memory cells. In operation, one of the memory cells in a NAND string can be selected while other memory cells in the NAND string are unselected.

The threshold voltages of the unselected memory cells in a NAND string vary along the NAND string depending on their data values stored, and in addition have temperature dependency, where the threshold voltages decrease with increasing temperature. Consequently the resistance of the NAND string and the current through the NAND string will vary due to the temperature dependency of unselected memory cells, and may reduce sensing margins in a read operation.

It is desirable to provide a NAND string structure where variations in the resistance of a NAND string and the current through the NAND string due to the temperature dependency of unselected memory cells are reduced.

SUMMARY

A memory device comprises a first NAND string that includes a first plurality of memory cells and a first string select switch arranged in series, the first plurality of memory cells including a selected memory cell and unselected memory cells, the first string select switch disposed between a first bit line and a first end of the first plurality of memory cells, and a second NAND string that includes a second plurality of memory cells and a second string select switch arranged in series, the second string select switch disposed between a second bit line and a first end of the second plurality of memory cells. Word lines are coupled to memory cells in the first plurality of memory cells and memory cells in the second plurality of memory cells. A string select line is coupled to the first and second string select switches. The first and second string select switches have a threshold voltage that can vary in a manner complementary to absolute temperature. A driver is coupled to at least one of the word lines and the string select line, the driver providing a voltage varying in a manner complementary to absolute temperature.

In one embodiment, word line drivers are coupled to the word lines, configured to provide pass voltages to the word lines coupled to the unselected memory cells, the pass voltages varying in a manner complementary to absolute temperature, and to provide an operation voltage to the word line coupled to the selected memory cell, such as in a read operation. The operation voltage can be a read voltage. The unselected memory cells have threshold voltages that vary along the NAND string depending on their data values stored, and in addition vary in a manner complementary to absolute temperature. The pass voltages can vary in a manner complementary to absolute temperature, so that the difference between the pass voltages and the threshold voltages will be more uniform.

In some embodiments, a string select line driver coupled to the string select switch is configured to provide a string select line voltage to the string select line coupled to the first and second string select switches, the string select line voltage varying in a manner complementary to absolute temperature.

The string select line voltage can operate within an operating range to turn on the first string select switch and turn off the second string select switch within a temperature range between a low temperature and a high temperature, while a program voltage is applied to the first bit line and an inhibit voltage higher than the program voltage is applied to the second bit line, such as in a program operation.

String select switches in NAND strings in a NAND array including the first and second NAND strings can have a first threshold voltage distribution at the low temperature, and a second threshold voltage distribution at the high temperature. The first threshold voltage distribution can have a first low boundary (B1) and a first high boundary (B3). The second threshold voltage distribution can have a second low boundary (B0) lower than the first low boundary and a second high boundary (B2) lower than the first high boundary.

The operating range at the low temperature is higher than the first high boundary (B3) and lower than the first low boundary (B1) plus the inhibit voltage, and the operating range at the high temperature is higher than the second high boundary (B2) and lower than the second low boundary (B0) plus the inhibit voltage.

A string select line voltage varying in a manner complementary to absolute temperature having the operating ranges at the low temperature and at the high temperature as described herein can provide larger margins for both a successful program operation and a successful inhibit operation, as compared to a string select line voltage without temperature compensation. Here a string select line voltage varying in a manner complementary to absolute temperature as described herein is applied to a first string select switch for a program operation in a first NAND string and a second string select switch for an inhibit operation in a second NAND string.

In some embodiments, the memory device comprises a first ground select switch between a reference line and a second end of the first plurality of memory cells, and a second ground select switch between a reference line and a second end of the second plurality of memory cells. The first and second ground select switches have a threshold voltage that can vary in a manner complementary to absolute temperature. A ground select line driver coupled to the first and second ground select switches is configured to provide a ground select line voltage to the first and second ground select switches, the ground select line voltage varying in a manner complementary to absolute temperature.

A method is also described, for operating a memory device as described herein. The method can include applying a voltage varying in a manner complementary to absolute temperature to at least one of the word lines and the string select line. In one embodiment, pass voltages are applied to the unselected memory cells, the pass voltages varying in a manner complementary to absolute temperature, and an operation voltage is applied to the selected memory cell. The operation voltage can be a read voltage.

In some embodiments, a string select line voltage is applied to the string select line coupled to the first and second string select switches, the string select line voltage varying in a manner complementary to absolute temperature.

The string select line voltage can operate within an operating range to turn on the first string select switch and turn off the second string select switch within a temperature range between a low temperature and a high temperature, while a program voltage is applied to the first bit line and an inhibit voltage higher than the program voltage is applied to the second bit line.

String select switches in NAND strings in a NAND array including the first and second NAND strings can have a first threshold voltage distribution at the low temperature, and a second threshold voltage distribution at the high temperature. The first threshold voltage distribution can have a first low boundary (B1) and a first high boundary (B3). The second threshold voltage distribution can have a second low boundary (B0) lower than the first low boundary and a second high boundary (B2) lower than the first high boundary.

The operating range at the low temperature is higher than the first high boundary (B3) and lower than the first low boundary (B1) plus the inhibit voltage, and the operating range at the high temperature is higher than the second high boundary (B2) and lower than the second low boundary (B0) plus the inhibit voltage.

In some embodiments, the first NAND string includes a first ground select switch between a reference line and a second end of the first plurality of memory cells, and the second NAND string includes a second ground select switch between a reference line and a second end of the second plurality of memory cells. The first and second ground select switches have a threshold voltage that can vary in a manner complementary to absolute temperature. A ground select line voltage can be applied to the first and second ground select switches, the ground select line voltage varying in a manner complementary to absolute temperature.

Other aspects and advantages of the present invention can be seen on review of the drawings, the detailed description and the claims, which follow.

BRIEF DESCRIPTION OF THE DRAWINGS

FIG. 2 is a timing diagram for one example of the bias voltages in a conventional read operation.

FIG. 3 is a timing diagram for one example of the bias voltages in a read operation where CTAT pass voltages are applied to unselected word lines.

FIG. 4 is a timing diagram for one example of the bias voltages in a read operation where a CTAT voltage is applied to a string select line.

FIG. 5 is a timing diagram for one example of the bias voltages in a read operation where a CTAT voltage is applied to a ground select line.

FIG. 6 is a timing diagram for one example of the bias voltages in a read operation where CTAT voltages are applied to unselected word lines, a string select line, and a ground select line.

DETAILED DESCRIPTION

Figure 1:
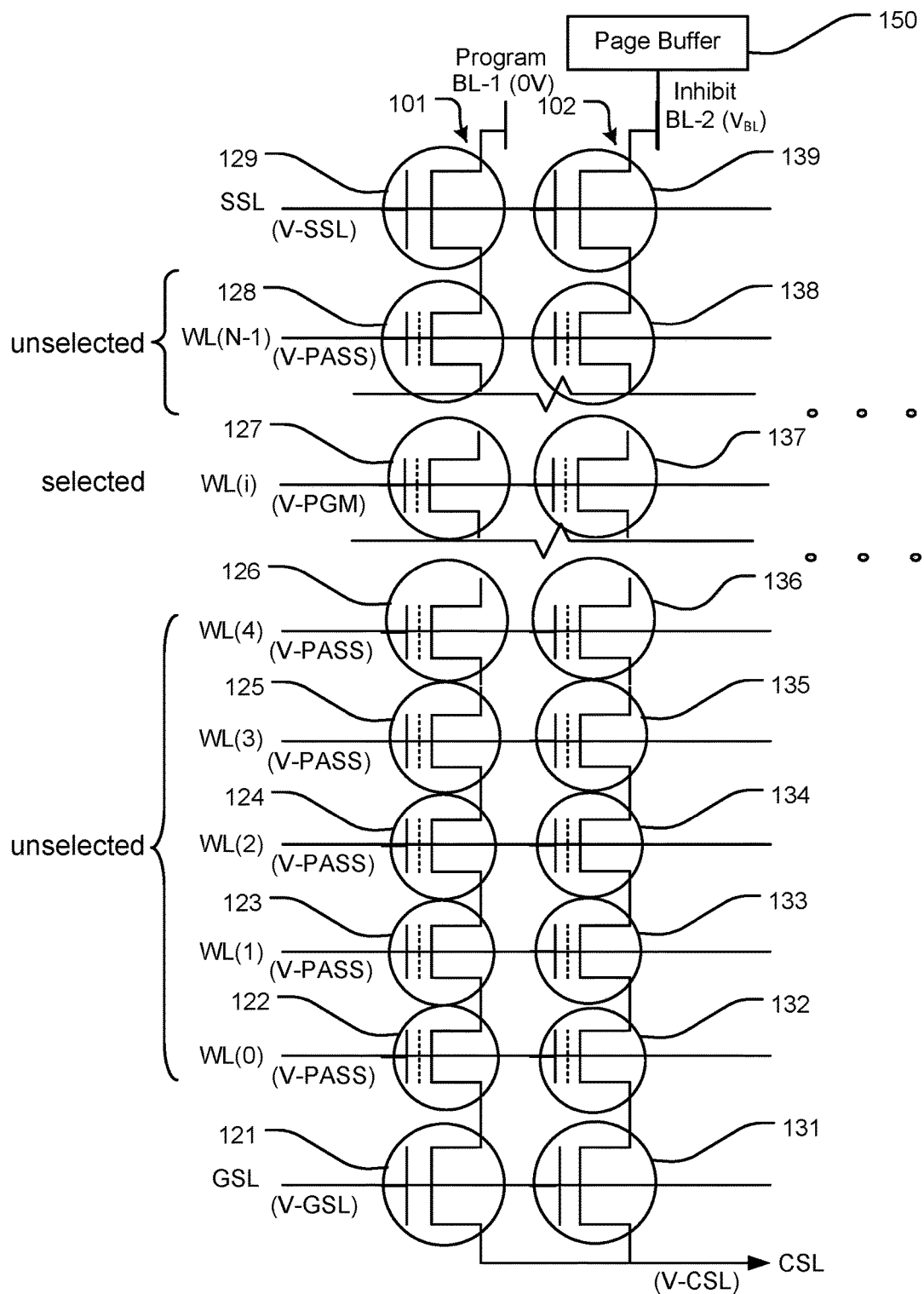
FIG. 1 is a circuit diagram showing part of a NAND array comprising a NAND string that includes a plurality of memory cells arranged in series in a semiconductor body.

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a circuit diagram showing part of a NAND array comprising a NAND string (e.g. 101) that includes a plurality of memory cells arranged in series in a semiconductor body. A memory cell (e.g. 127) in the NAND string can be selected, and other memory cells (e.g. 121-126, 128) in the NAND string can be unselected. The unselected memory cells have threshold voltages that can vary in a manner complementary to absolute temperature.

First and second NAND strings 101 and 102 are coupled to respective first and second bit lines BL-1 and BL-2 and to a reference line (e.g. CSL). A first string select switch (e.g. 129) in the first NAND string 101 is arranged between a first bit line (e.g. BL-1) and a first end (e.g. 128) of the plurality of memory cells in the first NAND string 101. A second string select switch (e.g. 139) in the second NAND string 102 is arranged between a second bit line (e.g. BL-2) and a first end (e.g. 138) of the plurality of memory cells in the second NAND string 102. The first and second string select switches have threshold voltages that can vary in a manner complementary to absolute temperature. A first ground select switch (e.g. 121) in the first NAND string 101 is arranged between the reference line and a second end (e.g. 122) of the plurality of memory cells in the first NAND string 101. A second ground select switch (e.g. 131) in the second NAND string 102 is arranged between the reference line and a second end (e.g. 132) of the plurality of memory cells in the second NAND string 102. The first and second ground select switches have threshold voltages that can vary in a manner complementary to absolute temperature. A string select line SSL is coupled to gates of the first and second string select switches (e.g. 129 and 139). A ground select line GSL is coupled to gates of the first and second ground select switches (e.g. 121 and 131).

The memory device includes a plurality of word lines including N word lines coupled to the first and second NAND strings. Word lines in the plurality of word lines (e.g. WL(0), WL(1), WL(2), WL(3), WL(4), ..., WL(i), ..., WL(N−1)) are coupled to corresponding memory cells in the plurality of memory cells (e.g. 122-128, 132-138) on the first and second NAND strings.

For the purpose of illustration, the bias voltages are shown for programming a selected memory cell (e.g. 127) coupled to a corresponding word line WL(i) in the first NAND string 101. The selected bit line (e.g. BL-1) is biased at a bit line program voltage (e.g. 0V). The unselected bit line (e.g. BL-2) is biased at a bit line inhibit voltage $V_{BL}$ higher than the program voltage. The bit line inhibit voltage $V_{BL}$ (e.g. 1.5V) can be applied to the second bit line (e.g. BL-2, FIG. 1) by a page buffer (e.g. 150) coupled to the second bit line. A program voltage (e.g. V-PGM, FIG. 1) can be applied to the selected word line (e.g. WL(i)) coupled to the selected memory cell (e.g. 127). The reference line (e.g. CSL) is biased at a common source line voltage (e.g. V-CSL).

For reading a selected memory cell (e.g. 127) coupled to a corresponding word line WL(i) in the NAND string 101, the selected bit line (e.g. BL-1) can be biased at a bit line read voltage (e.g. V-BL, FIG. 2). The unselected bit line (e.g. BL-2) can be biased at a voltage such as ground (e.g. GND=0V). A read voltage (e.g. V-read, FIG. 2) can be applied to the selected word line (e.g. WL(i)) coupled to the selected memory cell (e.g. 127). The reference line (e.g. CSL) can be biased at a common source line voltage (e.g. V-CSL).

Pass voltages (e.g. V-pass) are applied to unselected word lines (e.g. WL(0), WL(1), WL(2), WL(3), WL(4), WL(N−1)) coupled to the unselected memory cells (e.g. 122-126, 128), where the pass voltages vary along the string depending on their data values stored, and in addition vary in a manner complementary to absolute temperature.

A string select line voltage (e.g. V-SSL) is applied to a string select line SSL coupled to the first and second string select switches (e.g. 129 and 139), where the string select line voltage can vary in a manner complementary to absolute temperature. When both the threshold voltage of the string select switch and the string select line voltage vary in a manner complementary to absolute temperature, decreasing with increasing temperature, variations in a difference between the threshold voltage of the string select switch and the string select line voltage over temperature can be reduced. As a result, the resistance of the string select switch will be more consistent, allowing for tighter sensing margins in a read operation.

For a successful program operation on the first NAND string, a string select line voltage high enough to turn on the first string select switch on the first NAND string can be applied to the first string select switch (e.g. 129). For a successful inhibit operation on the second NAND string, a string select line voltage low enough to turn off the second string select switch on the second NAND string can be applied to the second string select switch (e.g. 139). For both a successful program operation on the first NAND string and a successful inhibit operation on the second NAND string over temperature, the string select line voltage applied to the first and second string select switches on the first and second NAND strings can operate within an operating range, as described in reference to FIGS. 9A and 9B.

A ground select line voltage (e.g. V-GSL) is applied to a ground select line GSL coupled to the first and second ground select switches (e.g. 121 and 131), where the ground select line voltage can vary in a manner complementary to absolute temperature. When both the threshold voltage of the ground select switch and the ground select line voltage vary in a manner complementary to absolute temperature, decreasing with increasing temperature, variations in a difference between the threshold voltage of the ground select switch and the ground select line voltage over temperature can be reduced.

As used herein, the term "complementary to absolute temperature" refers to a circuit behavior where a voltage decreases with increasing temperature. For example, a threshold voltage of a memory cell that decreases with increasing temperature can be described as "complementary to absolute temperature" or abbreviated as CTAT. For example, word line drivers that provide voltages that decrease with increasing temperature can be described as "complementary to absolute temperature" word line drivers or abbreviated as CTAT WL drivers. Similarly, a string select line driver that provides a voltage that decreases with increasing temperature can be described as a "complementary to absolute temperature" string select line driver or abbreviated as a CTAT SSL driver. A ground select line driver that provides a voltage that decreases with increasing temperature can be described as a "complementary to absolute temperature" ground select line driver, or abbreviated as a CTAT GSL driver.

FIG. 2 is a timing diagram for one example of the bias voltages in a conventional read operation, in reference to the NAND string structure shown in FIG. 1. For the purpose of illustration, the bias voltages are shown for reading a selected memory cell (e.g. 127, FIG. 1) coupled to corresponding word line (e.g. WL(i), FIG. 1) in the NAND string (e.g. 101, FIG. 1).

The selected bit line BL (e.g. BL-1, FIG. 1) is biased at a bit line voltage V B L. The reference line CSL is biased at a common source line voltage V-CSL. A read voltage V-read is applied to the selected word line WL (e.g. WL(i), FIG. 1) coupled to the selected memory cell (e.g. 127, FIG. 1). Pass voltages V-pass are applied to unselected word lines WL (e.g. WL(0), WL(1), WL(2), WL(3), WL(4), WL(N−1), FIG. 1) coupled to the unselected memory cells (e.g. 122-126, 128, FIG. 1). Pass voltages V-pass can be nominally equal or have different nominal voltage levels along the NAND string.

The unselected memory cells can have threshold voltages that vary along the string depending on their data values stored, and in addition vary in a manner complementary to absolute temperature, decreasing with increasing temperature. Consequently the resistance of the NAND string and the current through the NAND string can vary due to the temperature dependency of unselected memory cells, and may reduce sensing margins in a read operation.

A string select line voltage V-SSL is applied to a string select line SSL coupled to the string select switch. A ground select line voltage V-GSL is applied to a ground select line GSL coupled to the ground select switch.

The string select switch and the ground select switch can have threshold voltages that are complementary to absolute temperature, decreasing with increasing temperature. Consequently the resistance of the NAND string and the current through the NAND string can vary due to the temperature dependency of the string select switch and the ground select switch, and may reduce sensing margins in a read operation.

FIG. 3 is a timing diagram for one example of the bias voltages in a read operation where CTAT pass voltages are applied to unselected word lines. For the purpose of illustration, the bias voltages are shown for reading a selected memory cell (e.g. 127, FIG. 1) coupled to corresponding word line (e.g. WL(i), FIG. 1) in the NAND string (e.g. 101, FIG. 1).

The selected bit line BL (e.g. BL-1, FIG. 1) is biased at a bit line voltage V B L. The reference line CSL is biased at a common source line voltage V-CSL. A read voltage V-read is applied to the selected word line WL (e.g. WL(i), FIG. 1) coupled to the selected memory cell (e.g. 127, FIG. 1).

Pass voltages V-pass-CTAT are applied to unselected word lines WL coupled to the unselected memory cells (e.g. 122-126, 128, FIG. 1). The pass voltages V-pass-CTAT can have voltage levels that vary along the NAND string depending on data values stored in the unselected memory cells in the NAND string, and depending on relative locations of the unselected memory cells to a selected memory cell in the NAND string. In addition the pass voltages V-pass-CTAT can vary in a manner complementary to absolute temperature, decreasing with increasing temperature, as indicated by the arrow. When both the threshold voltages of the unselected memory cells and the pass voltages V-pass-CTAT vary in a manner complementary to absolute temperature, decreasing with increasing temperature, variations in a difference between the threshold voltages and the pass voltages V-pass-CTAT over temperature can be reduced. Consequently variations in the resistance of a NAND string and the current through the NAND string due to temperature dependency of unselected memory cells can be reduced.

Word line drivers coupled to the unselected memory cells can provide pass voltages V-pass to unselected word lines coupled to the unselected memory cells, where the pass voltages can vary in a manner complementary to absolute temperature. For instance, simulations can be performed to characterize the behavior of threshold voltages of unselected memory cells in a NAND string over temperature. Circuits in the word line drivers can then be fine-tuned to match the behavior of the threshold voltages of unselected memory cells, so that variations in a difference between the threshold voltages of unselected memory cells and the pass voltages V-pass-CTAT applied to the unselected memory cells over temperature can be reduced.

A string select line voltage V-SSL applied to a string select line SSL coupled to the string select switch can be as described in reference to FIG. 2 or 4. A ground select line voltage V-GSL applied to a ground select line GSL coupled to the ground select switch can be as described in reference to FIG. 2 or 5.

FIG. 4 is a timing diagram for one example of the bias voltages in a read operation where a CTAT voltage is applied to a string select line SSL. For the purpose of illustration, the bias voltages are shown for reading a selected memory cell (e.g. 127, FIG. 1) coupled to corresponding word line (e.g. WL(i), FIG. 1) in the NAND string (e.g. 101, FIG. 1).

The selected bit line BL (e.g. BL-1, FIG. 1) is biased at a bit line voltage V B L. The reference line CSL is biased at a common source line voltage V-CSL. A read voltage V-read is applied to the selected word line WL (e.g. WL(i), FIG. 1) coupled to the selected memory cell (e.g. 127, FIG. 1). Pass voltages V-pass are applied to unselected word lines WL (e.g. WL(0), WL(1), WL(2), WL(3), WL(4), WL(N−1), FIG. 1) coupled to the unselected memory cells (e.g. 122-126, 128, FIG. 1). A ground select line voltage V-GSL is applied to a ground select line GSL coupled to the ground select switch.

A string select line voltage V-SSL-CTAT is applied to the string select line SSL coupled to the string select switch. The string select line voltage V-SSL-CTAT can vary in a manner complementary to absolute temperature, decreasing with increasing temperature, as indicated by the arrow. When both the threshold voltage of the string select switch and the string select line voltage V-SSL-CTAT can vary in a manner complementary to absolute temperature, decreasing with increasing temperature, variations in a difference between the threshold voltage and the string select line voltage V-SSL-CTAT over temperature can be reduced. Consequently variations in the resistance of a NAND string and the current through the NAND string due to temperature dependency of the string select switch can be reduced.

A string select line driver coupled to the string select switch can provide a string select line voltage V-SSL-CTAT to a string select line SSL coupled to the string select switch, where the string select line voltage can vary in a manner complementary to absolute temperature. For instance, simulations can be performed to characterize the behavior of the threshold voltage of the string select switch in a NAND string over temperature. Circuits in the string select line driver can then be fine-tuned to match the behavior of the threshold voltage of the string select switch, so that variations in a difference between the threshold voltage of the string select switch and the string select line voltage V-SSL-CTAT applied to the string select switch over temperature can be reduced.

FIG. 5 is a timing diagram for one example of the bias voltages in a read operation where a CTAT voltage is applied to a ground select line GSL. For the purpose of illustration, the bias voltages are shown for reading a selected memory cell (e.g. 127, FIG. 1) coupled to corresponding word line (e.g. WL(i), FIG. 1) in the NAND string (e.g. 101, FIG. 1).

The selected bit line BL (e.g. BL-1, FIG. 1) is biased at a bit line voltage V B L. The reference line CSL is biased at a common source line voltage V-CSL. A read voltage V-read is applied to the selected word line WL (e.g. WL(i), FIG. 1) coupled to the selected memory cell (e.g. 127, FIG. 1). Pass voltages V-pass are applied to unselected word lines WL (e.g. WL(0), WL(1), WL(2), WL(3), WL(4), WL(N−1), FIG. 1) coupled to the unselected memory cells (e.g. 122-126, 128, FIG. 1). A string select line voltage V-SSL is applied to a string select line SSL coupled to the string select switch.

A ground select line voltage V-GSL-CTAT is applied to the ground select line GSL coupled to the ground select switch. The ground select line voltage V-GSL-CTAT can vary in a manner complementary to absolute temperature, decreasing with increasing temperature, as indicated by the arrow. When both the threshold voltage of the ground select switch and the ground select line voltage V-GSL-CTAT can vary in a manner complementary to absolute temperature, decreasing with increasing temperature, variations in a difference between the threshold voltage and the ground select line voltage V-GSL-CTAT over temperature can be reduced. Consequently variations in the resistance of a NAND string and the current through the NAND string due to temperature dependency of the ground select switch can be reduced.

A ground select line driver coupled to the ground select switch can provide a ground select line voltage V-GSL-CTAT to a ground select line GSL coupled to the ground select switch, where the ground select line voltage can vary in a manner complementary to absolute temperature. For instance, simulations can be performed to characterize the behavior of the threshold voltage of the ground select switch in a NAND string over temperature. Circuits in the ground select line driver can then be fine-tuned to match the behavior of the threshold voltage of the ground select switch, so that variations in a difference between the threshold voltage of the ground select switch and the ground select line voltage V-GSL-CTAT applied to the ground select switch over temperature can be reduced.

FIG. 6 is a timing diagram for one example of the bias voltages in a read operation where CTAT voltages are applied to unselected word lines, a string select line, and a ground select line.

Specifically, pass voltages V-pass-CTAT are applied to unselected word lines WL coupled to the unselected memory cells as described in reference to FIG. 3, a string select line voltage V-SSL-CTAT is applied to the string select line SSL coupled to the string select switch as described in reference to FIG. 4, and a ground select line voltage V-GSL-CTAT is applied to the ground select line GSL coupled to the ground select switch as described in reference to FIG. 5. The pass voltages V-pass-CTAT can have voltage levels that vary along the NAND string depending on data values stored in the unselected memory cells in the NAND string, and depending on relative locations of the unselected memory cells to a selected memory cell in the NAND string. In addition The pass voltages V-pass-CTAT can vary in a manner complementary to absolute temperature.

In embodiments, a combination can include the CTAT pass voltages V-pass-CTAT applied to unselected word lines WL and the CTAT string select line voltage V-SSL-CTAT applied to the string select line SSL, without the CTAT ground select line voltage V-GSL-CTAT applied to the ground select line GSL. Another combination can include the CTAT pass voltages V-pass-CTAT applied to unselected word lines WL and the CTAT ground select line voltage V-GSL-CTAT applied to the ground select line SSL, without the CTAT string select line voltage V-SSL-CTAT applied to the string select line SSL. Yet another combination can include the CTAT string select line voltage V-SSL-CTAT applied to the string select line SSL and the CTAT ground select line voltage V-GSL-CTAT applied to the ground select line SSL, without the CTAT pass voltages V-pass-CTAT applied to unselected word lines WL.

Figure 7C:
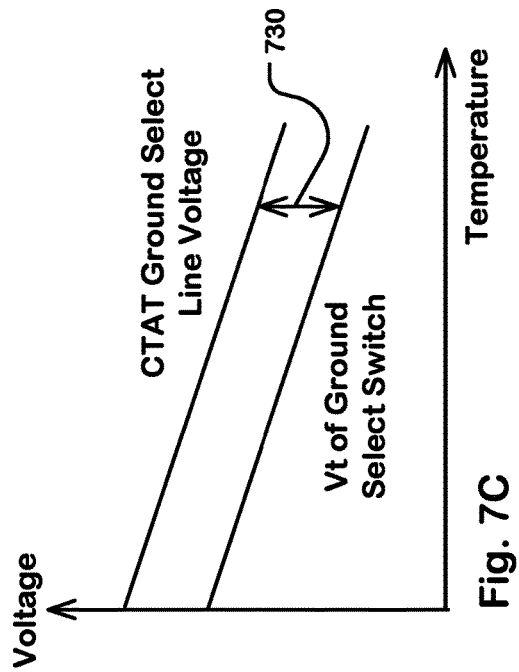
FIG. 7C illustrates a simplified chart illustrating an example difference between the threshold voltage of the ground select switch in a NAND string and the CTAT ground select line voltage on the ground select switch over temperature.
Figure 7A:
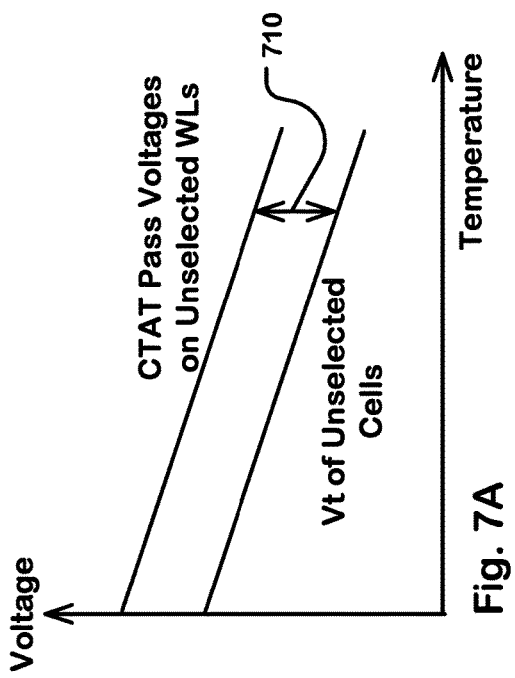
FIG. 7A illustrates a simplified chart illustrating an example difference between the threshold voltages of unselected memory cells in a NAND string and the CTAT pass voltages on the unselected memory cells over temperature.

FIG. 7A illustrates a simplified chart illustrating an example difference between the threshold voltages of unselected memory cells in a NAND string and the CTAT pass voltages on the unselected memory cells over temperature.

When both the threshold voltages of the unselected memory cells and the pass voltages V-pass-CTAT on the unselected memory cells vary in a manner complementary to absolute temperature, decreasing with increasing temperature, variations in a difference (e.g. 710) between the threshold voltages and the pass voltages V-pass-CTAT over temperature can be reduced, so that the difference between the pass voltages and the threshold voltages will be more uniform. Consequently variations in the resistance of a NAND string and the current through the NAND string due to temperature dependency of unselected memory cells can be reduced.

In the example of FIG. 7A, the threshold voltages of unselected memory cells in a NAND string and the CTAT pass voltages V-pass-CTAT on the unselected memory cells are represented as linear over temperature for heuristics reasons. In practice they are not perfectly linear over temperature, at least due to manufacturing variances in unselected memory cells and in word line drivers coupled to the unselected memory cells, relative locations of the unselected memory cells to a selected memory cell in a NAND string, and data values stored in the unselected memory cells.

Figure 7B:
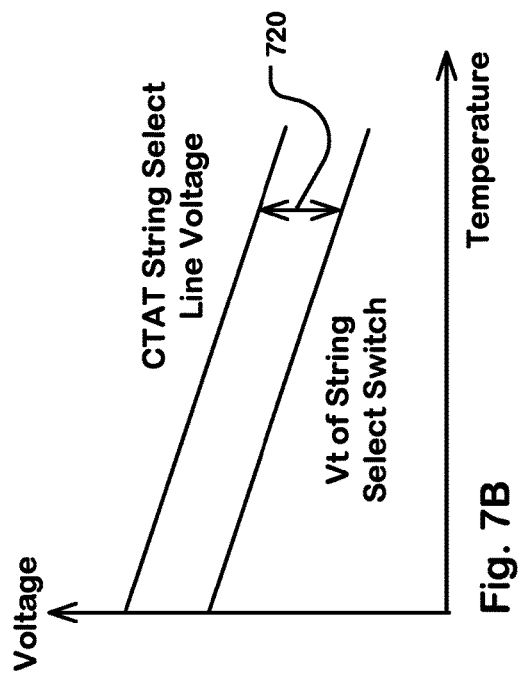
FIG. 7B illustrates a simplified chart illustrating an example difference between the threshold voltage of the string select switch in a NAND string and the CTAT string select line voltage on the string select switch over temperature.

FIG. 7B illustrates a simplified chart illustrating an example difference (e.g. 720) between the threshold voltage of the string select switch in a NAND string and the CTAT string select line voltage on the string select switch over temperature.

In the example of FIG. 7B, the threshold voltage Vt of the string select switch and the CTAT string select line voltage V-SSL-CTAT on the string select switch may appear to be linear over temperature, but in practice they are not perfectly linear over temperature, at least due to manufacturing variances in the string select switch and in a string select line driver coupled to the string select switch.

FIG. 7C illustrates a simplified chart illustrating an example difference (e.g. 730) between the threshold voltage of the ground select switch in a NAND string and the CTAT ground select line voltage on the ground select switch over temperature.

In the example of FIG. 7C, the threshold voltage Vt of the ground select switch and the ground select line voltage V-GSL-CTAT on the ground select switch may appear to be linear over temperature, but in practice are not perfectly linear over temperature, at least due to manufacturing variances in the ground select switch and in a ground select line driver coupled to the ground select switch.

Figure 8:
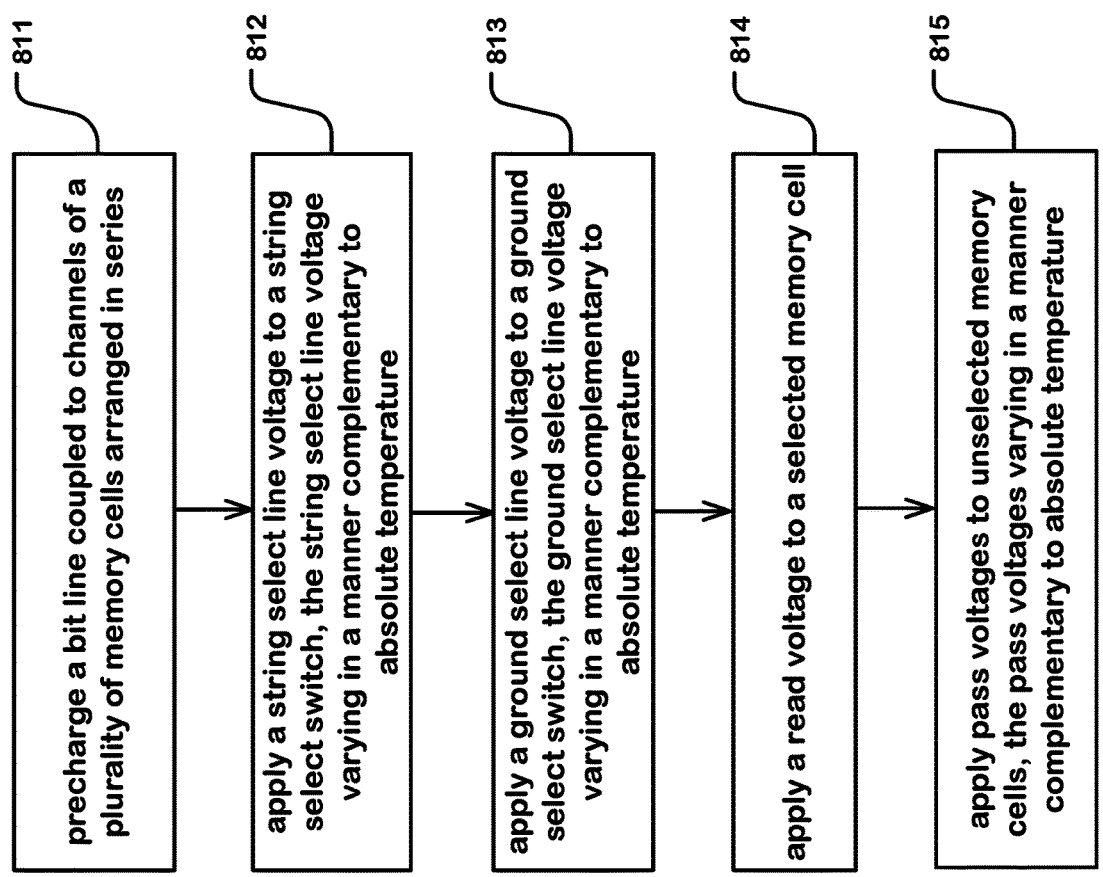
FIG. 8 is a simplified flowchart for a method of operating a NAND string that includes a plurality of memory cells arranged in series including a selected memory cell and unselected memory cells.

FIG. 8 is a simplified flowchart for a method of operating a NAND string that includes a plurality of memory cells arranged in series including a selected memory cell and unselected memory cells. The unselected memory cells have threshold voltages that can vary in a manner complementary to absolute temperature. At Step 811, a bit line coupled to channels of a plurality of memory cells arranged in series in a NAND string is pre-charged to a voltage level (e.g. V-BL, FIG. 6).

At Step 812, a string select line voltage (e.g. V-SSL-CTAT, FIG. 6) is applied to a string select switch in the NAND string to turn on the string select switch, where the string select line voltage can vary in a manner complementary to absolute temperature. The string select switch can be between the bit line and a first end of the plurality of memory cells, where the string select switch can have a threshold voltage that can vary in a manner complementary to absolute temperature.

At Step 813, a ground select line voltage (e.g. V-GSL-CTAT, FIG. 6) is applied to a ground select switch in the NAND string to turn on the ground select switch, connecting the NAND string to a reference line (e.g. CSL) at a reference voltage (e.g. V-CSL, FIG. 6) such as ground on the source side of the NAND string, where the ground select line voltage can vary in a manner complementary to absolute temperature. The ground select switch can be between the reference line and a second end of the plurality of memory cells, where the ground select switch can have a threshold voltage that can vary in a manner complementary to absolute temperature.

At Step 814, an operation voltage, such as a read voltage (e.g. V-Read, FIG. 6), is applied to a selected word line coupled to a selected memory cell in the NAND string. The read voltage can be sufficient to turn on the selected memory cell.

At Step 815, pass voltages (e.g. V-PASS-CTAT, FIG. 6) are applied to unselected word lines coupled to the unselected memory cells to enable current flow through the channels of the unselected memory cells, where the pass voltages can vary in a manner complementary to absolute temperature.

The example flowchart shown in FIG. 8 does not require any particular order in which to apply the CTAT pass voltages, the CTAT string select line voltage, and the CTAG ground select line voltage.

Figure 9A:
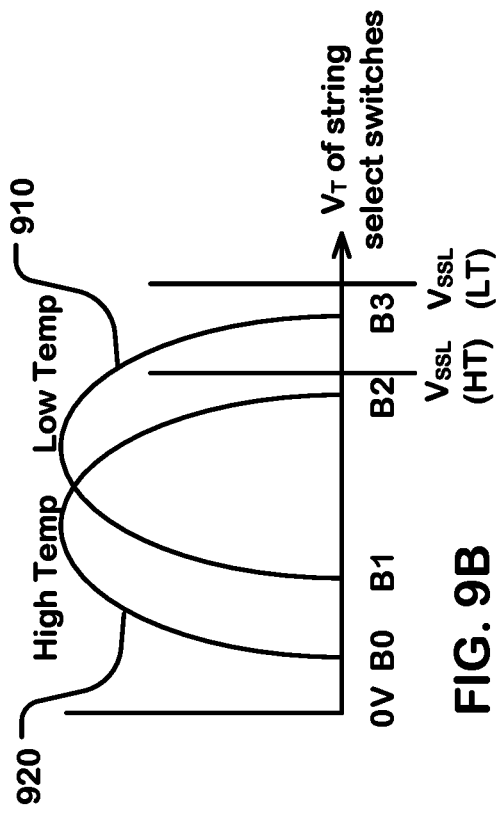
FIG. 9A is an example graph of threshold voltage distributions of string select switches in NAND strings, and a string select line voltage not compensated for temperature.

FIG. 9A is an example graph of threshold voltage distributions of string select switches in NAND strings, and a string select line voltage not compensated for temperature. FIG. 9A illustrates the temperature dependency of the threshold voltage of string select switches in NAND strings, where the threshold voltages of string select switches increase with decreasing temperature and decrease with increasing temperature within a temperature range between a low temperature and a high temperature.

As shown in FIG. 9A, string select switches in NAND strings in a NAND array including the first and second NAND strings have a first threshold voltage ($V_T$) distribution 910 at the low temperature and a second threshold voltage ($V_T$) distribution 920 at the high temperature. The first threshold voltage distribution has a first low boundary (B1) and a first high boundary (B3), and the second threshold voltage distribution has a second low boundary (B0) lower than the first low boundary and a second high boundary (B2) lower than the first high boundary.

A first NAND string (e.g. 101, FIG. 1) and a second NAND string (e.g. 102, FIG. 1) in a NAND array (e.g. 1012, FIG. 10) share a string select line SSL. The string select line SSL is coupled to the first string select switch (e.g. 129, FIG. 1) on the first NAND string and the second string select switch (e.g. 139, FIG. 1) on the second NAND string.

In order to program the first NAND string, a string select line voltage $V_{SSL}$ higher than the high boundary B3 of the first threshold voltage distribution at the low temperature can be applied to the first string select switch via the string select line SSL. In order to inhibit the second NAND string, a string select line voltage $V_{SSL}$ lower than $V_{BL}+B0$ can be applied to the second string select switch via the string select line SSL, to prevent leakage of the second NAND string. $V_{BL}$ is an inhibit voltage that can be applied to the second bit line (e.g. BL-2, FIG. 1) by a page buffer (e.g. 150, FIG. 1) coupled to the second bit line, and B0 is the second low boundary of the second threshold voltage distribution at the high temperature.

For a successful program operation, ($V_{SSL}$−B3)>0V can turn on the first string select switch (e.g. 129, FIG. 1) on the first NAND string (e.g. 101, FIG. 1), and keep channels of the memory cells in the first NAND string at the voltage (e.g. 0V) applied at the first bit line (e.g. BL-1, FIG. 1) coupled to the first NAND string.

For a successful inhibit operation, ($V_{SSL}$−$V_{BL}$−B0)<0V can turn off the second string select switch (e.g. 139, FIG. 1) of the second NAND string (e.g. 102, FIG. 1), and keep channels of the memory cells in the second NAND string floating and produce a self-boosting condition.

For both a successful program operation and a successful inhibit operation at a string select line voltage $V_{SSL}$ not compensated for temperature, a $V_{SSL}$ can operate within an operating range. Such an operating range can be expressed as "B3<$V_{SSL}$<B0+$V_{BL}$", by combining ($V_{SSL}$−B3)>0V for a successful program operation and ($V_{SSL}$−$V_{BL}$−B0)<0V for a successful inhibit operation. If a $V_{SSL}$ is outside the operating range, then either a program operation or an inhibit operation may fail. For instance, if a $V_{SSL}$ is higher than "B0+$V_{BL}$", then an inhibit operation may fail. If a $V_{SSL}$ is lower than B3, then program operation may fail.

When a string select line voltage $V_{SSL}$ is not compensated for temperature, in accordance with the operating range "B3<$V_{SSL}$<B0+$V_{BL}$", an operating margin for both a successful program operation and a successful inhibit operation at a string select line voltage $V_{SSL}$ can be expressed as B0+$V_{BL}$−B3.

Figure 9B:
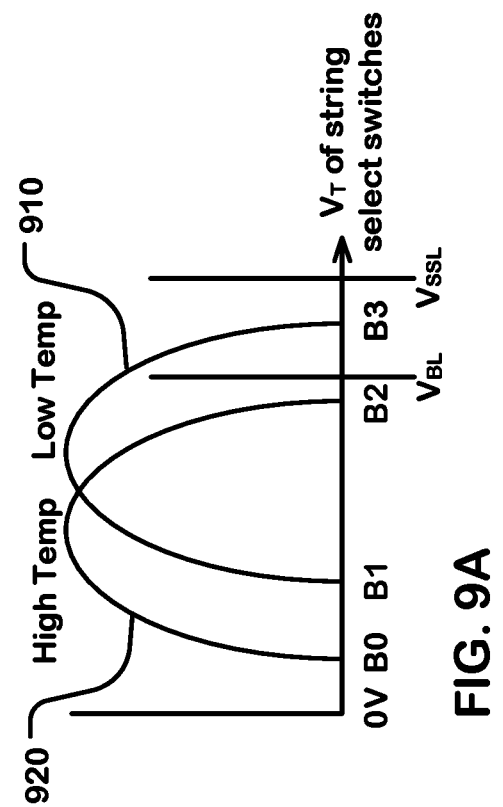
FIG. 9B is an example graph of threshold voltage distributions of string select switches in NAND strings, and a string select line voltage varying in a manner complementary to absolute temperature applied to a string select switch.

FIG. 9B is an example graph of threshold voltage distributions of string select switches in NAND strings, and a string select line voltage varying in a manner complementary to absolute temperature applied to a string select switch. A first threshold voltage ($V_T$) distribution 910 at the low temperature having a first low boundary B1 and a first high boundary B3, and a second threshold voltage ($V_T$) distribution 920 at the high temperature having a second low boundary B0 and a second high boundary B2 are as described in reference to FIG. 9A, and not repeated here.

Using the technology described herein, a string select line voltage varying in a manner complementary to absolute temperature can be applied to a first string select switch for a program operation and applied to a second string select switch for an inhibit operation. In FIG. 9B, a string select line voltage varying in a manner complementary to absolute temperature is illustrated as a string select line voltage $V_{SSL}$(LT) at the low temperature and a string select line voltage $V_{SSL}$(HT) at the high temperature. A string select line voltage $V_{SSL}$(LT) at the low temperature is higher than a string select line voltage $V_{SSL}$(HT) at the high temperature. A string select line voltage $V_{SSL}$(LT) is higher than the first high boundary B3 of the low temperature range of threshold voltages. A string select line voltage $V_{SSL}$(HT) is between the second high boundary B2 of the second threshold voltage distribution at the high temperature and the first high boundary B3 of the first threshold voltage distribution at the low temperature.

At the low temperature, in order to program the first NAND string, a string select line voltage $V_{SSL}$(LT) higher than the first high boundary B3 of the first threshold voltage distribution at the low temperature can be applied to the first string select switch.

At the low temperature, in order to inhibit the second NAND string, the string select line voltage $V_{SSL}$(LT) lower than $V_{BL}$+B1 can be applied to the second string select switch to prevent leakage of the second NAND string. $V_{BL}$ is an inhibit voltage that can be applied to the second bit line (e.g. BL-2, FIG. 1) by a page buffer (e.g. 150, FIG. 1) coupled to the second bit line, and B1 is the first low boundary of the first threshold voltage distribution at the low temperature.

At the high temperature, in order to program the first NAND string, a string select line voltage $V_{SSL}$(HT) higher than the second high boundary B2 of the second threshold voltage distribution at the high temperature can be applied to the first string select switch.

At the high temperature, in order to inhibit the second NAND string, the string select line voltage $V_{SSL}$(HT) lower than $V_{BL}$+B0 can be applied to the second string select switch to prevent leakage of the second NAND string. $V_{BL}$ is an inhibit voltage as described herein, and B0 is the second low boundary of the second threshold voltage distribution at the high temperature.

At the low temperature, for a successful program operation, $(V_{SSL}(LT)-B3)>0V$ can turn on the string select switch (e.g. 129, FIG. 1) on the first NAND string (e.g. 101, FIG. 1), and keep channels of the memory cells in the first NAND string at the program voltage (e.g. 0V) applied at the first bit line (e.g. BL-1, FIG. 1) coupled to the first NAND string. At the high temperature, for a successful program operation, $(V_{SSL}(HT)-B2)>0V$ can turn on the string select switch (e.g. 129, FIG. 1) on the first NAND string (e.g. 101, FIG. 1), and keep channels of the memory cells in the first NAND string at the program voltage (e.g. 0V) applied at the first bit line (e.g. BL-1, FIG. 1) coupled to the first NAND string.

At the low temperature, for a successful inhibit operation, $(V_{SSL}(LT)-V_{BL}-B1)<0V$ can turn off the second string select switch (e.g. 139, FIG. 1) of the second NAND string (e.g. 102, FIG. 1), and keep channels of the memory cells in the second NAND string floating and produce a self-boosting condition. At the high temperature, for a successful inhibit operation, $(V_{SSL}(HT)-V_{BL}-B0)<0V$ can turn off the second string select switch (e.g. 139, FIG. 1) of the second NAND string (e.g. 102, FIG. 1), and keep channels of the memory cells in the second NAND string floating and produce a self-boosting condition.

At the low temperature, for both a successful program operation and a successful inhibit operation at a string select line voltage $V_{SSL}(LT)$, a $V_{SSL}(LT)$ can operate within an operating range at the low temperature. Such an operating range at the low temperature can be expressed as "$B3<V_{SSL}(LT)<B1+V_{BL}$", by combining $(V_{SSL}(LT)-B3)>0V$ for a successful program operation and $(V_{SSL}(LT)-V_{BL}-B1)<0V$ for a successful inhibit operation. At the low temperature, if a $V_{SSL}(LT)$ is outside the operating range at the low temperature, then either a program operation or an inhibit operation may fail. For instance, if a $V_{SSL}(LT)$ is higher than "$B1+V_{BL}$", then an inhibit operation may fail. If a $V_{SSL}(LT)$ is lower than B3, then a program operation may fail.

At the high temperature, for both a successful program operation and a successful inhibit operation at a string select line voltage $V_{SSL}(HT)$, a $V_{SSL}(HT)$ can operate within an operating range. Such an operating range at the high temperature can be expressed as "$B2<V_{SSL}(HT)<B0+V_{BL}$", by combining $(V_{SSL}(HT)-B2)>0V$ for a successful program operation and $(V_{SSL}(HT)-V_{BL}-B0)<0V$ for a successful inhibit operation. At the high temperature, if a $V_{SSL}(HT)$ is outside the operating range at the high temperature, then either a program operation or an inhibit operation may fail. For instance, if a $V_{SSL}(HT)$ is higher than "$B0+V_{BL}$", then an inhibit operation may fail. If a $V_{SSL}(HT)$ is lower than B2, then a program operation may fail.

At the low temperature, when a string select line voltage varying in a manner complementary to absolute temperature is applied to a first string select switch for a program operation and a second string select switch for an inhibit operation, in accordance with the operating range at the low temperature "$B3<V_{SSL}(LT)<B1+V_{BL}$", a low temperature operating margin for both a successful program operation and a successful inhibit operation at a string select line voltage $V_{SSL}(LT)$ can be expressed as $B1+V_{BL}-B3$, where $V_{BL}$ is an inhibit voltage as described herein.

At the high temperature, when a string select line voltage varying in a manner complementary to absolute temperature is applied to a first string select switch for a program operation and c, in accordance with the operating range at the high temperature "$B2<V_{SSL}(HT)<B0+V_{BL}$", a high temperature operating margin for both a successful program operation and a successful inhibit operation at a string select line voltage $V_{SSL}(HT)$ can be expressed as $B0+V_{BL}-B2$, where $V_{BL}$ is an inhibit voltage as described herein.

As described in connection with FIG. 9A, when a string select line voltage is not compensated for temperature, in accordance with the operating range "$B3<V_{SSL}<B0+V_{BL}$", an operating margin for both a successful program operation and a successful inhibit operation at a string select line voltage $V_{SSL}$ is $B0+V_{BL}-B3$.

In comparison, the low temperature operating margin of "$B1+V_{BL}-B3$" is larger than an operation margin "$B0+V_{BL}-B3$" without temperature compensation, because B1 is greater than B0. The high temperature operating margin of "$B0+V_{BL}-B2$" is larger than an operation margin "$B0+V_{BL}-B3$" without temperature compensation, because B2 is less than B3.

In one example, VBL=1.5V, B0=0.5V, B1=1V, B2=1.5V, B3=2V, VSSL(HT)=1.6V, VSSL(LT)=2.1V. Accordingly, without temperature compensation for a string select line voltage, an operating margin is $B0+V_{BL}-B3=0.5V+1.5V-2V=0V$. In comparison, with temperature compensation for a string select line voltage, an operating margin at the low temperature is $B1+V_{BL}-B3=1V+1.5V-2V=0.5V$, and an operating margin at the high temperature is $B0+V_{BL}-B2=0.5V+1.5V-1.5V=0.5V$. In this example, without temperature compensation, there is no operating margin for a string select line voltage, while with temperature compensation, there is an operating margin of 0.5V at the low temperature and the high temperature.

Larger margins for both a successful program operation and a successful inhibit operation, when a string select line voltage varying in a manner complementary to absolute temperature is applied to a first string select switch for a program operation and a second string select switch for an inhibit operation, can improve the reliability of a memory device including a NAND array of NAND strings.

For instance, simulations can be performed to characterize the behavior of threshold voltages of string select line drivers in NAND strings in a NAND array over temperature. Circuits in a string select line driver can then be fine-tuned to provide the larger margins as described herein, where a string select line driver is coupled to the first and second string select switches configured to provide a string select line voltage to the first and second string select switches, the string select line voltage varying in a manner complementary to absolute temperature.

Figure 10:
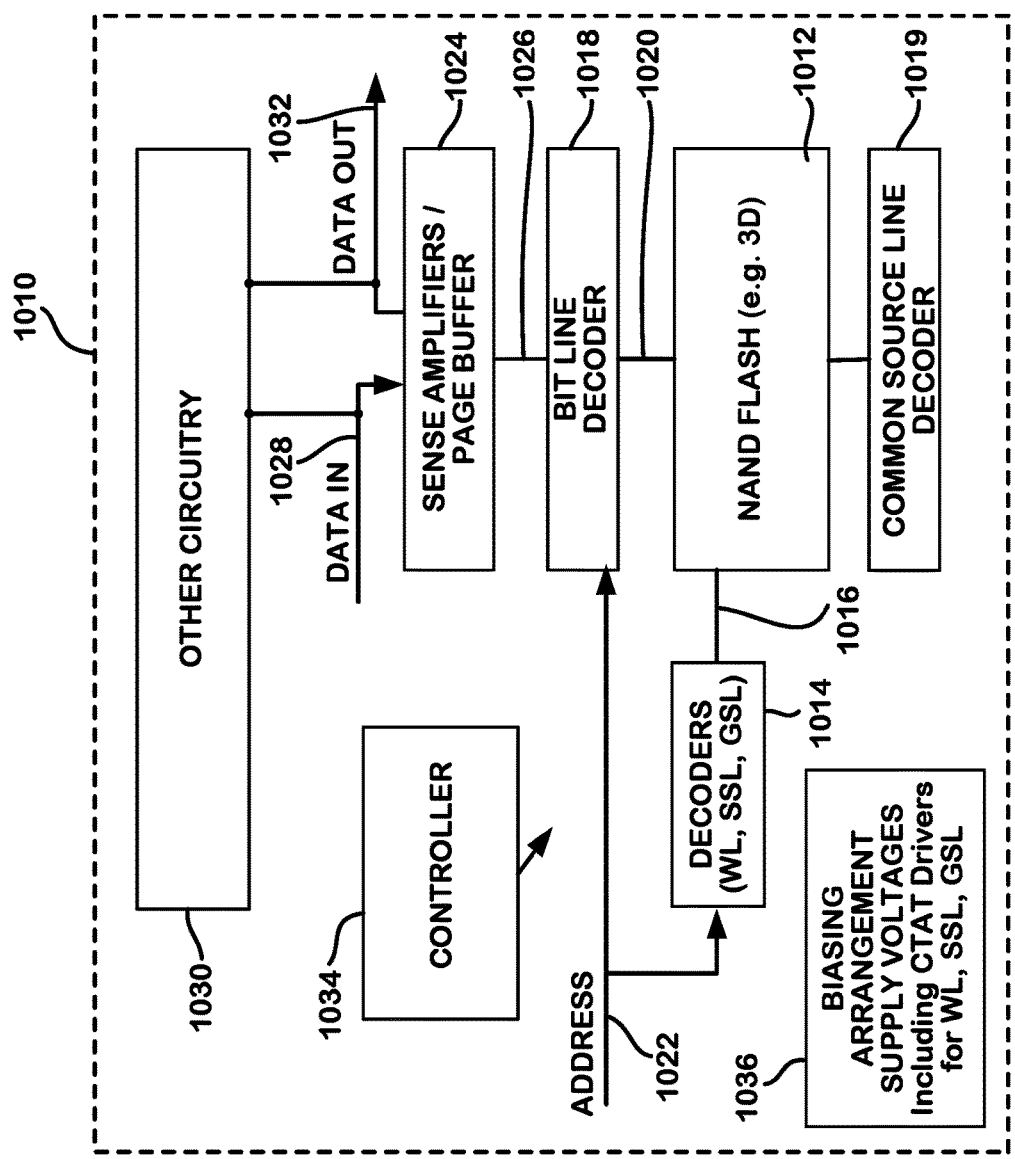
FIG. 10 is a block diagram of an integrated circuit memory employing memory cells and CTAT drivers in accordance with the present technology.

FIG. 10 is a block diagram of an integrated circuit memory employing memory cells and CTAT drivers in accordance with the present technology. The integrated circuit 1010 includes a memory array 1012 implemented using charge trapping memory cells or floating gate memory cells, for example, on a semiconductor substrate. A word line (or row), ground select and string select decoder 1014 are coupled to, and in electrical communication with, a plurality 1016 of word lines, string select lines and ground select lines, arranged along rows in the memory array 1012.

The memory array 1012 can include a NAND string that includes a plurality of memory cells arranged in series. In a read operation, word line drivers apply voltages for a selected memory cell and for unselected memory cells in the plurality of memory cells. The unselected memory cells can have threshold voltages that vary in a manner complementary to absolute temperature.

The memory array 1012 can include a string select switch between a bit line and a first end of the plurality of memory cells in a NAND string. The string select switch can have a threshold voltage that can vary in a manner complementary to absolute temperature.

The memory array 1012 can include a ground select switch between a reference line and a second end of the plurality of memory cells in a NAND string. The ground select switch can have a threshold voltage that can vary in a manner complementary to absolute temperature.

A bit line (column) decoder and drivers 1018 are coupled to and in electrical communication with a plurality of bit lines 1020 arranged along columns in the memory array 1012 for reading data from, and writing data to, the memory cells in the memory array 1012. Optionally, a common source line decoder 1019 is provided to support shared word line and shared bit line arrangements, such as can occur in 3D memory architectures. Addresses are supplied on bus 1022 to the word line decoder and string select decoder 1014 and to the bit line decoder 1018. Sense amplifiers and a page buffer in block 1024, including current sources for the read, program and erase modes, are coupled to the bit line decoder 1018 via data bus 1026. Data is supplied via the data-in line 1028 from input/output ports on the integrated circuit 1010 or from other data sources internal or external to the integrated circuit 1010, to the data-in structures in block 1024. In the illustrated embodiment, other circuitry 1030 is included on the integrated circuit 1010, such as a general purpose processor or special purpose application circuitry, or a combination of modules providing system-on-a-chip functionality supported by the memory cell array. Data is supplied via the data-out line 1032 from the sense amplifiers in block 1024 to input/output ports on the integrated circuit 1010, or to other data destinations internal or external to the integrated circuit 1010.

A controller 1034 implemented in this example, using a bias arrangement state machine, controls the application of bias arrangement supply voltages and current sources 1036, such as read, program, erase, erase verify, program verify voltages or currents for the word lines and bit lines, and controls the word line/source line operation using an access control process. The bias arrangement supply voltages can be generated by CTAT word line drivers, a CTAT string select line driver and a CTAT ground select line driver as described herein. CTAT word line drivers can be coupled to the unselected memory cells in a NAND string. In a read operation, the CTAT word line drivers can provide pass voltages to the unselected memory cells. The pass voltages generated by the CTAT word line drivers can vary in a manner complementary to absolute temperature.

A CTAT string select line driver can be coupled to the string select switch of a NAND string. In a read operation, the string select line driver can provide a string select line voltage to the string select line coupled to the string select switch. The string select line voltage generated by the CTAT string select line driver can vary in a manner complementary to absolute temperature.

A CTAT string select line driver can be coupled to the first string select switch of a first NAND string and the second string select switch of a second NAND string, configured to provide a string select line voltage to the first and second string select switches, the string select line voltage varying in a manner complementary to absolute temperature. The string select line voltage can operate within an operating range to turn on the first string select switch and turn off the second string select switch within a temperature range between a low temperature and a high temperature, while a program voltage is applied to the first bit line and an inhibit voltage higher than the program voltage is applied to the second bit line.

A CTAT ground select line driver can be coupled to the ground select switch in a NAND string. In a read operation, the ground select line driver can provide a ground select line voltage to a ground select line coupled to the ground select switch. The ground select line voltage generated by the CTAT ground select line driver can vary in a manner complementary to absolute temperature.

The controller 1034 can be implemented using special purpose logic circuitry as known in the art. In alternative embodiments, the controller 1034 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 1034.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating a memory device comprising a first NAND string that includes a first plurality of memory cells and a first string select switch arranged in series, the first string select switch disposed between a first bit line and a first end of the first plurality of memory cells, a second NAND string that includes a second plurality of memory cells and a second string select switch arranged in series, the second string select switch disposed between a second bit line and a first end of the second plurality of memory cells, word lines coupled to memory cells in the first plurality of memory cells and memory cells in the second plurality of memory cells, and a string select line coupled to the first and second string select switches, the method comprising:
   applying a voltage varying in a manner complementary to absolute temperature to at least one of the word lines and the string select line.

2. The method of claim 1, the first plurality of memory cells including a selected memory cell and unselected memory cells, the method comprising:
   applying pass voltages to the word lines coupled to the unselected memory cells, the pass voltages varying in a manner complementary to absolute temperature; and
   applying an operation voltage to the word line coupled to the selected memory cell.

3. The method of claim 2, wherein the operation voltage is a read voltage.

4. The method of claim 1, comprising:
   applying a string select line voltage to the string select line coupled to the first and second string select switches, the string select line voltage varying in a manner complementary to absolute temperature.

5. The method of claim 4, wherein the string select line voltage operates within an operating range to turn on the first string select switch and turn off the second string select switch within a temperature range between a low temperature and a high temperature, while a program voltage is applied to the first bit line and an inhibit voltage higher than the program voltage is applied to the second bit line.

6. The method of claim 5, string select switches in NAND strings in a NAND array including the first and second NAND strings having a first threshold voltage distribution at the low temperature, and a second threshold voltage distribution at the high temperature, the first threshold voltage distribution having a first low boundary and a first high boundary, and the second threshold voltage distribution having a second low boundary lower than the first low boundary and a second high boundary lower than the first high boundary, wherein the operating range at the low temperature is higher than the first high boundary and lower than the first low boundary plus the inhibit voltage, and the operating range at the high temperature is higher than the second high boundary and lower than the second low boundary plus the inhibit voltage.

7. The method of claim 1, wherein the first NAND string includes a first ground select switch between a reference line and a second end of the first plurality of memory cells, and the second NAND string includes a second ground select switch between a reference line and a second end of the second plurality of memory cells, the method comprising:

applying a ground select line voltage to the first and second ground select switches, the ground select line voltage varying in a manner complementary to absolute temperature.

8. A memory device comprising:

a first NAND string that includes a first plurality of memory cells and a first string select switch arranged in series, the first plurality of memory cells including a selected memory cell and unselected memory cells, the first string select switch disposed between a first bit line and a first end of the first plurality of memory cells;

a second NAND string that includes a second plurality of memory cells and a second string select switch arranged in series, the second string select switch disposed between a second bit line and a first end of the second plurality of memory cells;

word lines coupled to memory cells in the first plurality of memory cells and memory cells in the second plurality of memory cells;

a string select line coupled to the first and second string select switches; and a driver coupled to at least one of the word lines and the string select line, the driver providing a voltage varying in a manner complementary to absolute temperature.

9. The memory device of claim 8, comprising:

word line drivers coupled to the word lines, configured to provide pass voltages to the word lines coupled to the unselected memory cells, the pass voltages varying in a manner complementary to absolute temperature, and to provide an operation voltage to the word line coupled to the selected memory cell.

10. The memory device of claim 9, wherein the operation voltage is a read voltage.

11. The memory device of claim 8, comprising:

a string select line driver coupled to the string select line, configured to provide a string select line voltage to the string select line coupled to the first and second string select switches, the string select line voltage varying in a manner complementary to absolute temperature.

12. The memory device of claim 11, wherein the string select line voltage operates within an operating range to turn on the first string select switch and turn off the second string select switch within a temperature range between a low temperature and a high temperature, while a program voltage is applied to the first bit line and an inhibit voltage higher than the program voltage is applied to the second bit line.

13. The memory device of claim 12, string select switches in NAND strings in a NAND array including the first and second NAND strings having a first threshold voltage distribution at the low temperature, and a second threshold voltage distribution at the high temperature, the first threshold voltage distribution having a first low boundary and a first high boundary, and the second threshold voltage distribution having a second low boundary lower than the first low boundary and a second high boundary lower than the first high boundary, wherein the operating range at the low temperature is higher than the first high boundary and lower than the first low boundary plus the inhibit voltage, and the operating range at the high temperature is higher than the second high boundary and lower than the second low boundary plus the inhibit voltage.

14. The memory device of claim 8, comprising:

a first ground select switch between a reference line and a second end of the first plurality of memory cells;

a second ground select switch between a reference line and a second end of the second plurality of memory cells; and a ground select line driver coupled to the first and second ground select switches, configured to provide a ground select line voltage to the first and second ground select switches, the ground select line voltage varying in a manner complementary to absolute temperature.

* * * * *